United States Patent [19]

Hayashi

[11] Patent Number: 4,909,745

[45] Date of Patent: Mar. 20, 1990

[54] JUNCTION BLOCK

[75] Inventor: Hideharu Hayashi, Kosai, Japan

[73] Assignee: Yazaki Corporation, Tokyo, Japan

[21] Appl. No.: 244,014

[22] Filed: Sep. 14, 1988

[30] Foreign Application Priority Data

Sep. 18, 1987 [JP] Japan .............................. 62-141717[U]

[51] Int. Cl.⁴ ........................... H01R 9/09; H01R 4/60
[52] U.S. Cl. ....................................... 439/76; 439/190; 439/205; 439/519
[58] Field of Search ....................... 439/45, 74, 76, 65, 439/85, 205, 190, 519, 521

[56] References Cited

U.S. PATENT DOCUMENTS

| | | | |
|---|---|---|---|
| 4,534,609 | 8/1985 | White | 439/190 |
| 4,585,291 | 4/1986 | Noschese | 439/205 |
| 4,588,243 | 5/1986 | Ramsey et al. | 439/519 |
| 4,781,600 | 11/1988 | Sugiyama et al. | 439/65 |

Primary Examiner—P. Austin Bradley
Attorney, Agent, or Firm—Robbins & Laramie

[57] ABSTRACT

A junction block is composed of an upper casing accommodating a bus bar distribution board and a lower casing forming an integral connector housing for accommodating a mating connector. The bus bar has integral tabs extending rectangularly to the bus bar and into the connector housing through respective holes formed in the bottom wall of the connector housing. There is provided a deflecting barrier member in the shape of an elongate rectangular bar adjacent an opening which has necessarily been formed in the bottom wall of the connector housing as finished by plastic moulding. In case any water or water drops should creep into the connector housing via the opening in its bottom wall, they are prevented from reaching the tab base zone by the deflecting barrier member which serves to conduct creeping water or water drops downwardly or in the discharge direction. Hence, it will be avoided to cause short circuits or leakage currents to occur between the adjoining bus bars or terminals of the connector.

7 Claims, 3 Drawing Sheets

JUNCTION BLOCK

BACKGROUND OF THE INVENTION

1. Field of the Invention

The invention generally relates to a junction block for use with electric circuits in automobiles and in particular to an improvement on such junction block whereby it is made possible to prevent occurrence of leakage currents or short circuits at the inner junction through connectors with associated circuitry (wire harnesses).

2. Description of the Prior Art

With an ordinary junction block, it has commonly been designated that for securing mating connectors in their fixed connected positions within a connector housing of a junction block, the connector housing be provided with lock means composed of a lock chamber and a retainer pawl. When fabricating a lower casing and housing of such design by plastic moulding, the housing will necessarily be formed with an opening in its bottom wall through which the core is to be removed for withdrawal of the finished moulding from the pattern.

In the event, therefore, water should once soak or filter, from outside, into the casing through a lock portion of the upper and lower casings, for example, it flows, through the bus bar distribution board and through that opening, onto the bottom wall of the housing. The water then travels spreading along the bottom wall of the housing until it moistens the tabs and female terminals in the connector. This may cause leakage currents or short circuits to occur between the adjoining bus bars or female terminals in the casing. This objectionable problem arises frequently since the junction block usually is disposed within the engine room of the automobile where during the car washing, water under pressure tends to get in there may occur, within the junction block, dew condensation due to significant temperature differences between high and low.

Furthermore, with a junction block accomodating a number of connectors, it is usual in design that the connector housing may have some tab holes unused or left open without corresponding tabs being inserted therethrough. In that case, the same problem as described above may arise since external water may enter the connector housing through this unused hole and cause leakage currents or short circuits between the connector elements.

SUMMARY OF THE INVENTION

The invention, therefore, is directed to settle the above described problems by providing an improved junction block which is capable of effectively preventing occurrence of leakage currents or short circuits at the interconnections of the mating terminal elements in the connector within the block.

In order to achieve the above object, a junction block according to the invention comprises an upper casing and a lower casing forming in it a housing for receiving mating connectors and a bus bar distribution board, the bus bar having integral tabs which extend perpendicularly to the bus bar and into the connector housing through respective holes formed in the bottom wall of the connector housing, the improvement being that there is provided at least one deflecting barrier member adjacent an opening formed in the bottom wall of the housing, which opening has necessarily been formed in the bottom wall of the housing by the necessity of core removal in the moulding operation for the housing, or adjacent an unused hole, which otherwise would receive an associated tab, formed in the bottom wall of the housing, in such manner that the deflecting barrier member prohibits any water or water drops which have soaked in through the opening in the bottom wall of the housing or has been produced within the junction block due to dew condensation, from reaching the tab base zone in the housing.

The invention will now be described in further detail with reference to the accompanying drawings.

DETAILED DESCRIPTION OF THE INVENTION

Figure 1:
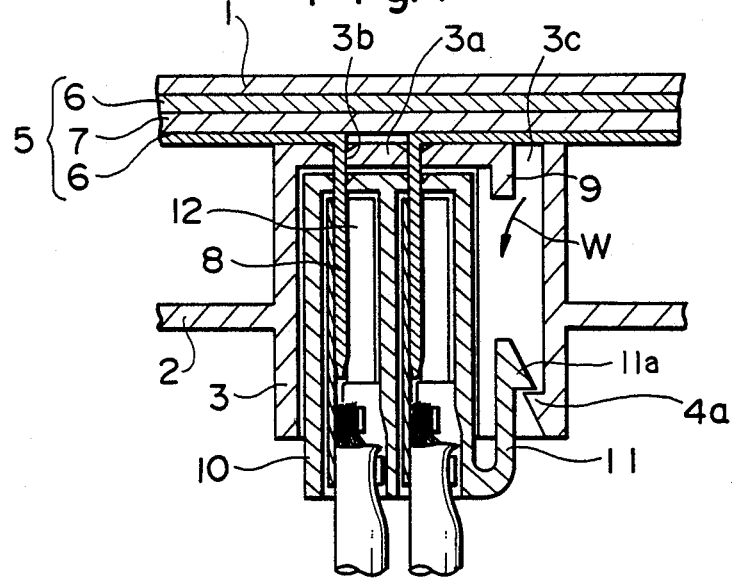
FIG. 1 is a secional view of an essential portion of a junction block construction according to an embodiment of the invention.
Figure 2:
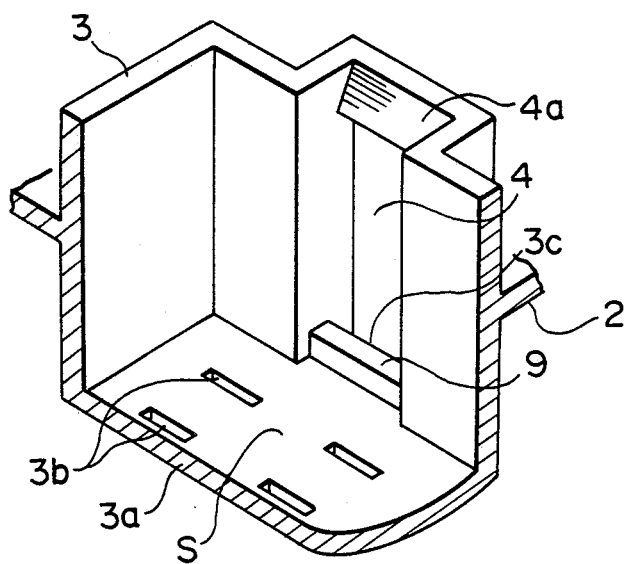
FIG. 2 is a perspective view, partly cut away, of a connector housing of FIG. 1 junction block with a deflecting barrier member of the invention and a not-shown opening for core removal formed in the bottom wall of the housing.
Figure 3:
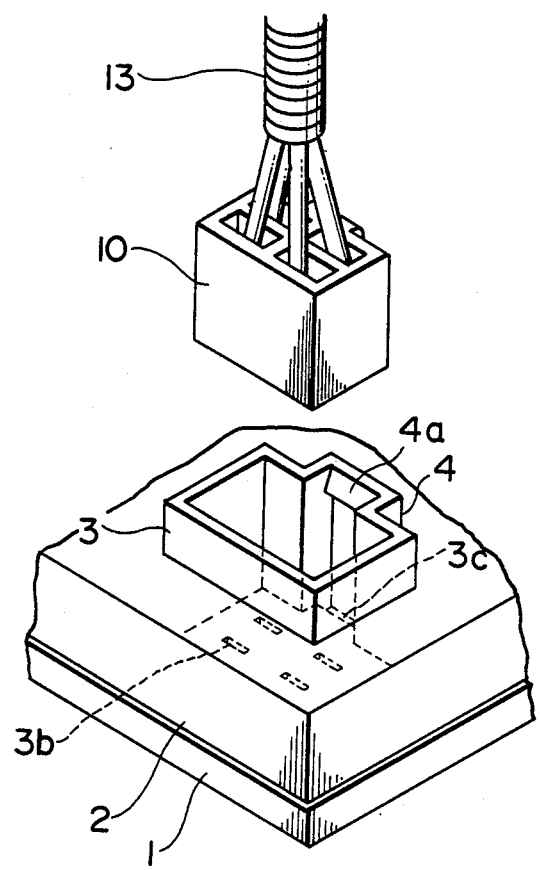
FIG. 3 is a perspective view showing the connector housing and its mating connector according to the prior art arrangement in separation from each other.

Before describing the invention which is illustrated in FIGS. 1 and 2, a prior art junction block will first be described with reference to FIGS. 3, 4, and 5 throughout which drawings like parts carry like reference numerals.

Reference numeral 1 indicates an upper casing of the junction block and 2 its lower casing. On the lower casing 2 is integrally formed a connector housing 3 for receiving a connector 10 attached to the distal end of a wire harness 13. The connector housing 3, as shown in FIGS. 3 and 4, is formed at its outer side with an expanded lock chamber 4 for accommodation of a lock arm 11 formed on the connector 10. The lock chamber 4 in turn is provided on its inner wall with a retainer pawl 4a which is adapted for engagement with a cooperating retainer pawl 11a formed at the extremity of the lock arm 11 on the connector 10. Reference numeral 5 indicates a bus bar distribution board housed in the casing, consisting of a number of bus bars 6 having selected circuit patterns and an insulating base plate 7. Tabs 8 extend perpendicularly to the bus bar and into the housing 3 through respective holes 3b. It is intended that these tabs 8, when the connector 10 is fitted in the housing 3, make electric contact with their mating female terminals 12.

With the thus arranged prior art junction block, it is necessary to provide lock means in the form of the lock chamber 4 and its retainer pawl 4a for the purpose of securing the mating connector 10 locked in position within the connector housing 3. When manufacturing the lower casing 2 and housing 3 by plastic moulding, accordingly, the housing 3 as finished is necessarily formed in its bottom wall 3a with an opening 3c through which the core for formation of the retainer pawl 4a is to be removed.

Figure 4:
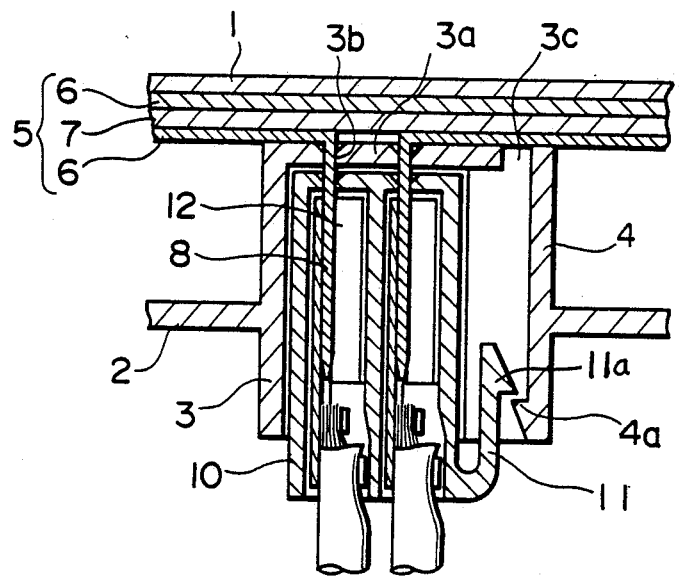
FIG. 4 is a sectional view showing the two parts in FIG. 3 being coupled with each other.
Figure 5:
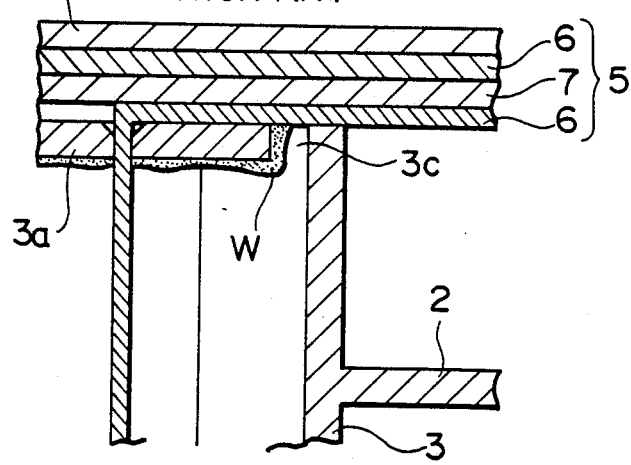
FIG. 5 is an enlarged sectional view of a portion of the FIG. 4 assembly.

If water should once enter the casing from outside through, for example, the locking portions (not shown) of the upper and casings, it (as shown in FIG. 4 and at W in FIG. 5) soaks through the bus bar distribution board 5 onto the bottom wall of the housing 3 via the opening 3c. The water then creeps spreadingly along the bottom wall 3a until it moistens the tabs 8 and female terminals 12. This may cause occurrence of short circuits or leakage currents between the adjoining bus bars 6 and 6 or female terminals 12 and 12 of the connector 10.

Furthermore, this is the case, too, where the soaking of water specified above takes place via an unused hole 3b with no tab inserted therethrough.

According to the invention, however, as shown in FIGS. 1 and 2, in a junction block comprising upper and lower casings 1 and 2 having on integral connector housing 3 for the receipt of the mating connector 10 and a bus bar distribution board 5, the bus bar having tabs 8 extending perpendicularly to it and into the housing 3 through respective holes in the bottom wall 3a of the housing 3; the improvement is that there is provided a deflecting barrier member 9 in the form of an elongate rectangular bar disposed adjacent the opening 3c in a manner to isolate the tab base zone S (See FIG. 2) from the opening 3c for creeping passage of water or water drops along the bottom wall 3a of the housing 3 therebetween, while directing water or water drops, which have been accumulated around the opening, downwardly to facilitate their discharge outside from the function block.

Alternatively, the connector housing 3 may be formed in separation from the lower casing 2 and the two members may be secured together by means of screws. Though this deflecting barrier member is shown as an elongate rectangular bar, it may be shaped otherwise, e.g. into a curved or C-shaped bar, an annulus, a ring of various sections, etc. This depends on the relative location of the junction block in the automobile, especially in the engine room, and its attitude as installed. The barrier member also is preferred to be of 1 mm and over in height, more preferably 3 mm to 5 mm, from the inner surface of the bottom wall 3a of the connector housing 3.

With this arrangement of the invention, any water or water drops which have entered from outside or been internally generated due to dew condensation, find no way to creep along the bottom wall 3c of the housing 3 into the tab base zone S because of the deflecting barrier member 9 which serves to conduct the water or water drops in the discharging direction indicated at W in FIG. 1.

Hence, it is assured to avoid occurrence of short circuits or leakage currents between the bus bars 6 and 6 or between the contact terminals 12 and 12 of the connector 10, which otherwise could lead to operational troubles such as malfunction of the relays, overheating of the distribution wire boards, etc.

What is claimed is:

1. A junction block comprising a first casing having a bus bar distribution board provided with a plurality of bus bars and a second casing defining a connector housing for accommodating a mating connector, at least one of said bus bars having at least one integral tab which extends generally perpendicularly to said bus bar and into said connector housing through a corresponding aperture formed in a bottom wall of the connector housing, characterized in that the junction block comprises a deflecting barrier member positioned adjacent an opening formed in the bottom wall of the connector housing for directing fluid which has entered said first casing away from said bus bar distribution board so as to prevent the fluid from contacting said bus bar tab.

2. A junction block according to claim 1, further characterized in that said deflecting barrier member is in the shape of an elongate rectangular bar.

3. A junction block according to claim 1, further characterized in that said deflecting barrier member is in the shape of an annular.

4. A junction block according to claim 1, further characterized in that said deflecting barrier member is in the shape of an arcuate rectangular bar.

5. A junction block according to claim 1, further characterized in that said deflecting barrier is configured as a generally C-shaped rectangular bar.

6. A junction block according to claim 1, further characterized in that said deflecting barrier member has a height of at least 1 mm as measured from the inner surface of the bottom wall of the connector housing.

7. A junction block according to claim 6, characterized in that said deflecting bar has a height which ranges from about 3 mm to about 5 mm as measured from the inner surface of the bottom wall of the connector housing.

* * * * *